United States Patent
Minamio et al.

(10) Patent No.: US 6,680,220 B2
(45) Date of Patent: Jan. 20, 2004

(54) METHOD OF EMBEDDING AN IDENTIFYING MARK ON THE RESIN SURFACE OF AN ENCAPSULATED SEMICONDUCTOR PACKAGE

(75) Inventors: Masanori Minamio, Takatsuki (JP); Hiroaki Fujimoto, Hirakata (JP); Ryuichi Sahara, Hirakata (JP); Toshiyuki Fukuda, Kyoto (JP); Toru Nomura, Amagasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/152,725

(22) Filed: May 23, 2002

(65) Prior Publication Data

US 2002/0137254 A1 Sep. 26, 2002

Related U.S. Application Data

(62) Division of application No. 09/983,524, filed on Oct. 24, 2001, now abandoned.

(30) Foreign Application Priority Data

Oct. 26, 2000 (JP) ........................................ 2000-326603

(51) Int. Cl.[7] .............................................. H01L 21/44
(52) U.S. Cl. ........................ 438/110; 438/112; 438/113
(58) Field of Search .......................... 438/15, 106, 107, 438/110, 111, 112, 113, 127, 800; 29/841, 855

(56) References Cited

U.S. PATENT DOCUMENTS

| 6,121,067 A | * | 9/2000 | Canella | ........................ 438/26 |
| 6,143,587 A | * | 11/2000 | Omizo | ........................ 438/106 |

FOREIGN PATENT DOCUMENTS

| JP | 05021685 A | * | 1/1993 |
| JP | 11297725 A | | 10/1999 |
| JP | 2000025074 A | | 1/2000 |

* cited by examiner

Primary Examiner—Kamand Cuneo
Assistant Examiner—Scott B. Geyer
(74) Attorney, Agent, or Firm—Nixon Peabody LLP; Donald R. Studebaker

(57) ABSTRACT

A semiconductor device includes: a wiring substrate; a wiring electrode; a semiconductor chip; a connecting member; a resin encapsulant; and a mark member. The wiring electrode is formed on the wiring substrate. The semiconductor chip is mounted on the wiring substrate. An electrode pad formed on the semiconductor chip and the wiring electrode are electrically connected to each other with the connecting member. The semiconductor chip, the wiring electrode, and the connecting member, for example, are molded with the resin encapsulant on the upper surface of the wiring substrate. The mark member is embedded in the upper surface of the resin encapsulant. The mark member, which is transferred from a transfer sheet in a single process step, is highly visible and can be formed efficiently.

6 Claims, 15 Drawing Sheets

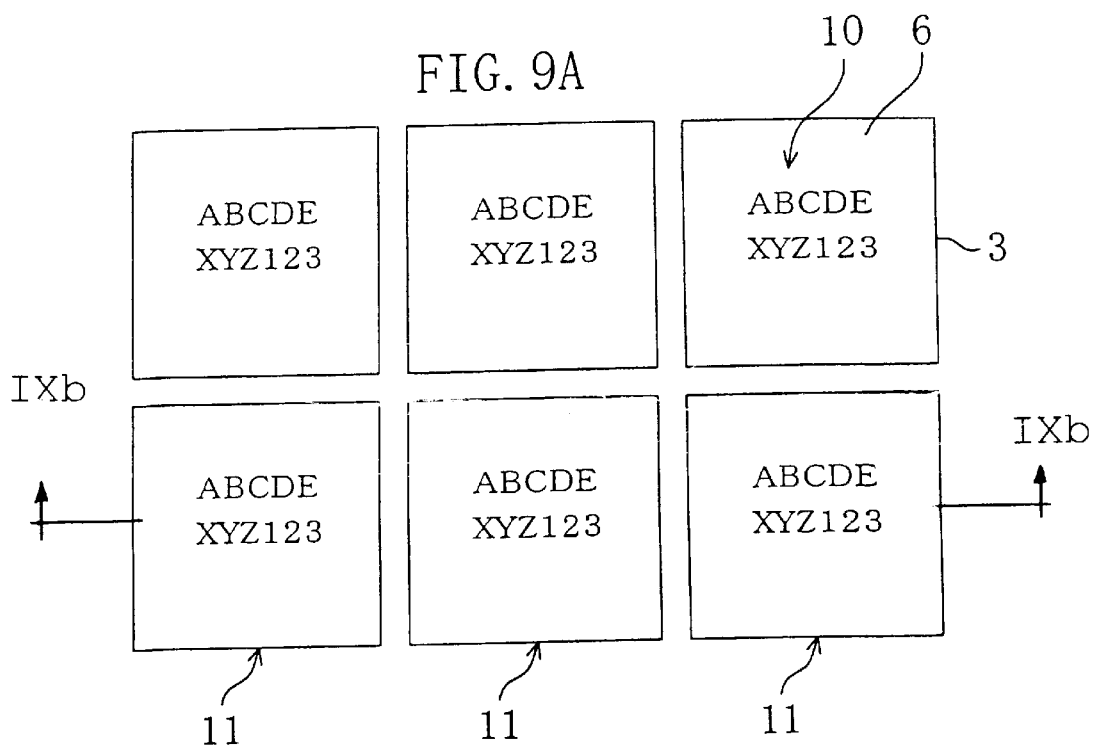
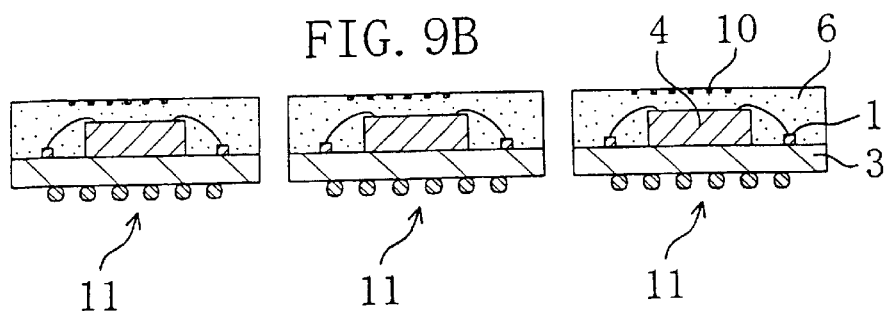

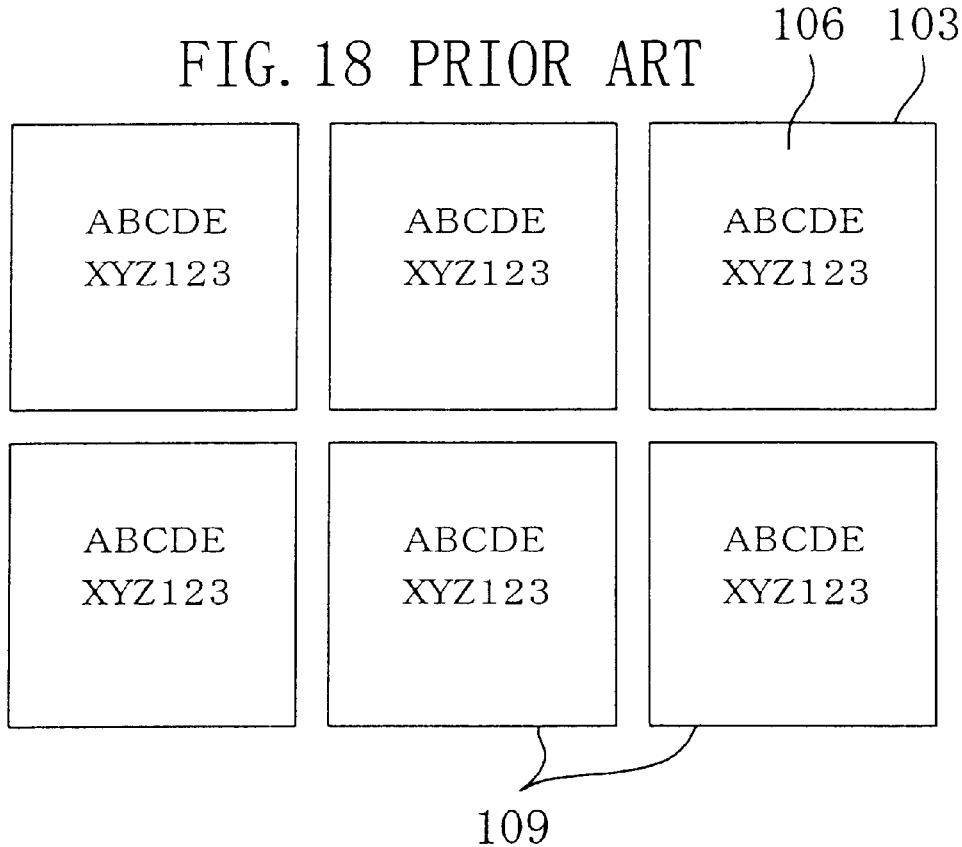

METHOD OF EMBEDDING AN IDENTIFYING MARK ON THE RESIN SURFACE OF AN ENCAPSULATED SEMICONDUCTOR PACKAGE

This application is a Divisional Application of U.S. patent application Ser. No. 09/983,524 filed Oct. 24, 2001 now abandoned.

BACKGROUND OF THE INVENTION

The present invention relates to a single-side-molded semiconductor device, which includes a wiring substrate having a ball grid array (BGA) arranged on the lower surface and a semiconductor chip molded with a resin encapsulant on the upper surface. The present invention also relates to a method for fabricating the device.

A semiconductor device of the BGA type has been available as a semiconductor device of an area array type. In the BGA type semiconductor device, a semiconductor chip is mounted and molded with a resin encapsulant on the upper surface of a substrate, and ball electrodes are attached to the lower surface thereof.

FIG. 12 is a plan view illustrating a known semiconductor device of the BGA type. FIG. 13 is a bottom view illustrating the known BGA type semiconductor device. FIG. 14 is a cross-sectional view thereof taken along the line XIVb—XIVb in FIG. 12.

As shown in FIGS. 12, 13 and 14, the known semiconductor device includes a wiring substrate 103, wiring electrodes 101, a semiconductor chip 104, metal fine wires 105, ball electrodes 102 and a resin encapsulant 106. The wiring substrate 103 is made of an insulating resin. The wiring electrodes 101 are formed on the wiring substrate 103. The semiconductor chip 104 is mounted on the wiring substrate 103 with the principal surface of the semiconductor chip 104 facing upward. Electrode pads (not shown) formed on the semiconductor chip 104 and the wiring electrodes 101 are electrically connected to each other with the metal fine wires 105. The ball electrodes 102 are formed on the lower surface of the wiring substrate 103. The resin encapsulant 106 is provided on the upper surface of the wiring substrate 103. The semiconductor chip 104, wiring electrodes 101, metal fine wires 105 and the like are molded with the resin encapsulant 106 on the upper surface of the wiring substrate 103. Although not shown in FIG. 14, external pad electrodes are formed on the lower surface of the wiring substrate 103. The external pad electrodes are electrically connected to the wiring electrodes 101 through the substrate. The ball electrodes 102 are formed on the external pad electrodes.

The known semiconductor device has an approximately rectangular planar shape and the adjacent side faces thereof are perpendicular to each other. The outer shape has been determined so that the fabrication process of the semiconductor device can be simplified. Also, marks 107 representing product name, product number, model number, manufacturer name, and symbol, for example, are inscribed on the upper surface of the resin encapsulant 106 by a laser marking process step.

In addition, in the known semiconductor device, the ball electrodes 102 attached to the wiring substrate 103 are solder balls. The solder balls are attached to the wiring substrate 103 so that the overall semiconductor device can be highly reliably mounted and bonded onto a motherboard. Also, as shown in FIG. 14, the ball electrodes 102 are arranged on the lower surface of the wiring substrate 103 in a latticed shape.

Next, the fabrication process of the known semiconductor device will be described. FIGS. 15A and 15B are respectively a plan view and a bottom view illustrating a wiring substrate in the known semiconductor device. FIGS. 16A and 16B are plan views illustrating a substrate preparation process step and a die bonding process step, respectively, in the fabrication process of the known semiconductor device. FIGS. 17A and 17B are plan views illustrating a wire bonding process step and a resin molding process step, respectively, in the fabrication process of the known semiconductor device. FIG. 18 is a plan view illustrating a cutting process step in the fabrication process of the known semiconductor device.

As shown in FIGS. 15A and 15B, the multiple wiring electrodes 101 are formed on the upper surface of the wiring substrate, and external pad electrodes 107 are formed on the lower surface of the wiring substrate. The external pad electrodes 107 are electrically connected to the wiring electrodes 101 through the substrate. The ball electrodes will be attached to the external pad electrodes 107 in the subsequent process step. The wiring substrate is a large-sized substrate on which multiple semiconductor chips will be mounted and which will be separated into individual semiconductor devices. The broken lines shown in FIGS. 15A and 15B are cutting lines, which will be used to separate the substrate into the individual semiconductor devices. Also, in each of the regions defined by the cutting lines in FIG. 15A, a central area surrounded by each array of the wiring electrodes 101 is a chip mounting area where each of the semiconductor chips is mounted by bonding.

First, the wiring substrate with the structure shown in FIGS. 15A and 15B is prepared in the substrate preparation process step shown in FIG. 16A.

Next, each of the semiconductor chips 104 is bonded, with an adhesive, onto each of the chip mounting areas of the wiring substrate in the die bonding process step shown in FIG. 16B.

Subsequently, the electrode pads (not shown) formed on the principal surface of each of the semiconductor chips 104 and their associate wiring electrodes 101 formed on the wiring substrate are electrically connected to each other with the metal fine wires 105 in the wire bonding process step shown in FIG. 17A.

Then, the members disposed on the upper surface of the wiring substrate, e.g., the semiconductor chips 104, wiring electrodes 101, metal fine wires 105, are transfer-molded with the resin encapsulant 106 in the resin molding process step shown in FIG. 17B. Thereafter, the marks 107 such as product name, product number, model number, manufacturer name, and symbol, for example, are inscribed on the upper surface of the resin encapsulant 106 for each of the semiconductor devices by a laser marker. The wiring electrodes 101 and semiconductor chips 104 are indicated by the broken lines in FIG. 17B. However, the metal fine wires 105 are not shown in the figure.

Next, in the cutting process step shown in FIG. 18, the wiring substrate having the upper surface entirely molded with the resin encapsulant 106 is cut along the cutting lines using a rotary blade, thereby obtaining individual semiconductor devices 109 of the BGA type. Hence, the semiconductor devices 109 with the structure shown in FIGS. 13 and 14 can be obtained.

In this example, the wiring substrate is cut, using the rotary blade, along the cutting lines indicated by the broken lines shown in FIGS. 15A and 15B. In this manner, the individual semiconductor devices can be obtained accurately. Normally, the separation by the rotary blade is performed using a dicing machine used in the fabrication process of the semiconductor device. Also, in the cutting process step, the wiring substrate is cut from either the lower surface or the resin encapsulant 106 side thereof.

In the subsequent process step, which is not shown, in each of the individual semiconductor devices 109, solder balls are attached to the external pad electrodes 107 formed on the lower surface of the wiring substrate 103. In this manner, the multiple ball electrodes are formed and will be used as external terminals.

The process steps for fabricating the known BGA type semiconductor device have been performed in the above-described manner, i.e., the large-sized substrate on which the multiple semiconductor chips can be mounted is used. Then, a large number of semiconductor chips are mounted on the substrate, the associate members are electrically connected, the members on the wiring substrate are molded with the resin encapsulant, and the marking is performed. Thereafter, the wiring substrate is cut into the individual semiconductor devices of the BGA type in the end.

Particularly, the marking process step is performed after the members disposed on the upper surface of the wiring substrate have been molded with the resin encapsulant 106. The marks are inscribed on the upper surface of the resin encapsulant 106 for each of the semiconductor devices by the laser marker in the process step shown in FIG. 17B.

However, it is inefficient to inscribe the marks by using the laser marker for each of such a large number of semiconductor devices, thus becoming an obstacle to increase in productivity in the assembly process. Also, depending on environments, the laser marks inscribed on the upper surface of the resin encapsulant sometimes have a low visibility and might be misidentified.

SUMMARY OF THE INVENTION

An object of this invention is to provide 1) a semiconductor device of the BGA type, which is easy to handle and which can be fabricated at low cost, by taking measures to put highly visible marks on a large number of semiconductor devices by a single process step, and 2) a method for fabricating the device.

An inventive semiconductor device includes: a wiring substrate; a semiconductor chip; an electrode; a connecting member; a resin encapsulant; and a mark member. The wiring substrate includes a wiring electrode and an external electrode, respectively, on the upper surface and the lower surface of the wiring substrate. The external electrode is to be electrically connected to the wiring electrode. The semiconductor chip is mounted on the wiring substrate. The electrode is formed on the semiconductor chip. The connecting member is used to connect the electrode of the semiconductor chip and the wiring electrode on the wiring substrate electrically to each other. The resin encapsulant molds the wiring substrate, the semiconductor chip, the connecting member and the wiring electrode. The mark member is visible and is embedded in the upper surface of the resin encapsulant.

According to the present invention, the mark member is embedded in the upper surface of the resin encapsulant. Thus, the visibility of the mark increases.

In one embodiment of the present invention, the device preferably further includes a ball electrode which is attached to the external electrode of the wiring substrate.

An inventive method for fabricating a semiconductor device includes the step of a) preparing a wiring substrate, which includes a wiring electrode and an external electrode, respectively, on the upper surface and the lower surface of the wiring substrate. The external electrode is to be electrically connected to the wiring electrode. The method further includes the step of b) mounting semiconductor chips on the wiring substrate. The method further includes the step of c) connecting an electrode of each of the semiconductor chips and the wiring electrode on the wiring substrate electrically to each other with a connecting member. The method further includes the step of d) disposing the wiring substrate on a face of one die of a molding die after the step c) has been performed; disposing a transfer sheet, on which a mark member has been formed, on a face of the other die of the molding die; and performing a resin molding process. The method further includes the step of e) removing the transfer sheet and embedding the mark member in the upper surface of a resin encapsulant by transcription, after the step d) has been performed.

According to the present invention, the mark is formed quickly by a single transfer method. Therefore, the fabrication cost can be reduced and the mark can be formed efficiently.

In one embodiment of the present invention, in the step e), the wiring substrate may be separated into individual semiconductor devices by using a rotary blade.

In another embodiment of the present invention, a ball electrode may be attached to the external electrode on the lower surface of the wiring substrate between the steps d) and e). In such an embodiment, a semiconductor device of the BGA type can be fabricated easily.

In still another embodiment, in the step a), the wiring substrate, on which the semiconductor chips can be mounted and which can be separated into individual semiconductor devices, is preferably prepared.

In still another embodiment, in the step d), a side of the transfer sheet may face the wiring substrate and the transfer sheet may be airtightly fixed on the face of the die of the molding die. The side includes the mark member formed thereon.

In still another embodiment, in the step d), the transfer sheet preferably includes the mark member formed thereon that is visible and that can be separated from the transfer sheet.

BRIEF DESCRIPTION OF THE DRAWINGS

FIGS. 9A and 9B are respectively a plan view, and a cross-sectional view taken along the line IXb—IXb, illustrating a cutting process step in the fabrication process of the semiconductor device of the embodiment.

FIG. 18 is a plan view illustrating a cutting process step in the fabrication process of the known semiconductor device.

DESCRIPTION OF THE PREFERRED EMBODIMENTS

Figure 1:
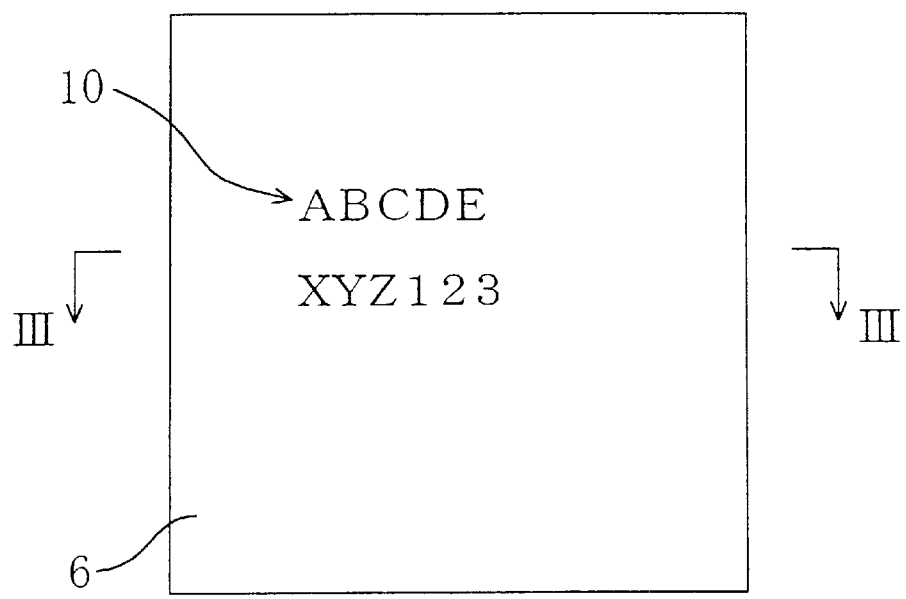
FIG. 1 is a plan view illustrating a semiconductor device in accordance with an embodiment of the present invention.
Figure 2:
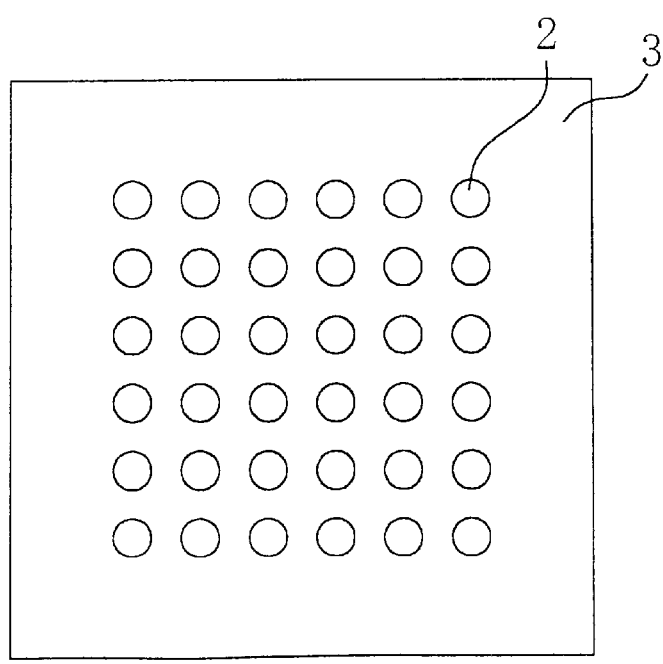
FIG. 2 is a bottom view illustrating the semiconductor device of the embodiment.
Figure 3:
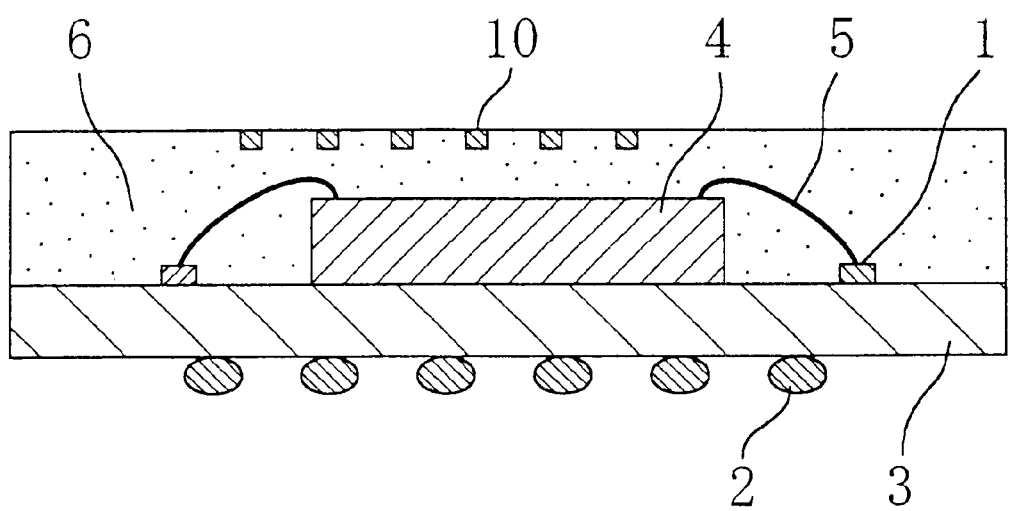
FIG. 3 is a cross-sectional view taken along the line III—III in FIG. 1, illustrating the semiconductor device of the embodiment.

FIG. 1 is a plan view illustrating a semiconductor device in accordance with an embodiment of the present invention. FIG. 2 is a bottom view illustrating the semiconductor device of the embodiment. FIG. 3 is a cross-sectional view thereof taken along the line III—III in FIG. 1.

As shown in FIGS. 1, 2, and 3, the semiconductor device of this embodiment includes a wiring substrate 3, wiring electrodes 1, a semiconductor chip 4, metal fine wires 5, ball electrodes 2 and a resin encapsulant 6. The wiring substrate 3 is made of an insulating resin. The wiring electrodes 1 are formed on the wiring substrate 3. The semiconductor chip 4 is mounted on the wiring substrate 3. Electrode pads (not shown) formed on the principal surface of the semiconductor chip 4 and the wiring electrodes 1 are electrically connected to each other with the metal fine wires 5. The ball electrodes 2 are formed on the lower surface of the wiring substrate 3. The semiconductor chip 4, wiring electrodes 1, metal fine wires 5 and the like are molded with the resin encapsulant 6 on the upper surface of the wiring substrate 3.

According to the semiconductor device of this embodiment, mark members 10 representing product name, product number, model number, manufacturer name, and symbol, for example, are embedded in the upper surface of the resin encapsulant 6 on the upper surface of the wiring substrate 3. The mark members 10 are, e.g., characters and symbols which are made of ink such as pigment or dyestuff, for example, or other easily visible materials.

Although not shown in FIG. 2, external pad electrodes are formed on the lower surface of the wiring substrate 3. The external pad electrodes are electrically connected to the wiring electrodes 1 through the substrate. The ball electrodes 2 are formed on the external pad electrodes. This is to say, the semiconductor device of this embodiment has the structure of a semiconductor device of the BGA type. Although not shown in FIGS. 3 and 4, an integrated circuit, on which e.g., a large number of transistors are disposed, is formed near the principal surface in the semiconductor chip. In addition, electrode pads to be used for connection with outside units are also formed on wiring layers formed near the principal surface in the semiconductor chip. And one end of each of the metal fine wires 5 is connected to the associated one of the electrode pads on the semiconductor chip.

In addition, in the semiconductor device of this embodiment, the ball electrodes 2 attached to the wiring substrate 3 are solder balls. The solder balls are attached so that the overall semiconductor device can be mounted and bonded onto a motherboard highly reliably. Also, as shown in FIG. 2, the ball electrodes 2 are arranged on the lower surface of the wiring substrate 3 in a latticed shape.

According to the semiconductor device of this embodiment, the mark members 10 are embedded in the upper surface of the resin encapsulant 6. Thus the marks of the semiconductor device of this embodiment have higher visibility than those inscribed by a laser marking process. Also, as will be described, since the mark members 10 are formed by transcription performed in a single process step, the fabricating costs are lower as compared to the laser marking. This is to say, according to the semiconductor device of this embodiment, the marking visibility can be increased and the marking costs can be reduced as well.

Figure 4A:
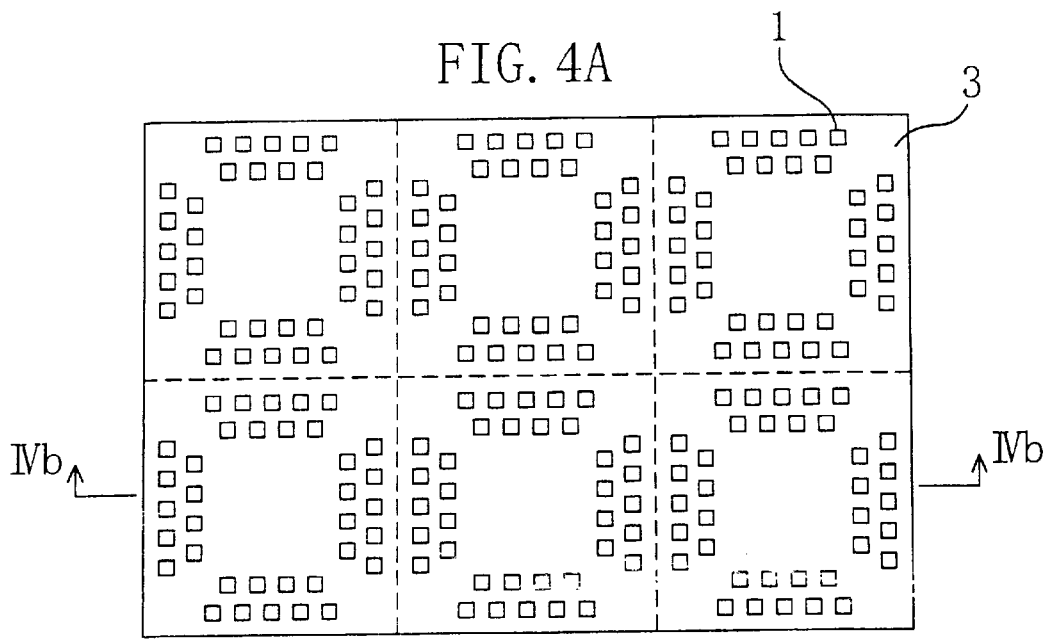
FIGS. 4A, 4B and 4C are respectively plan view, cross-sectional view taken along the line IVb—IVb, and bottom view illustrating a wiring substrate in accordance with the embodiment.
Figure 4B:
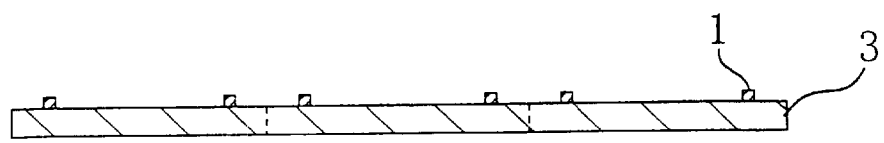
Figure 4C:
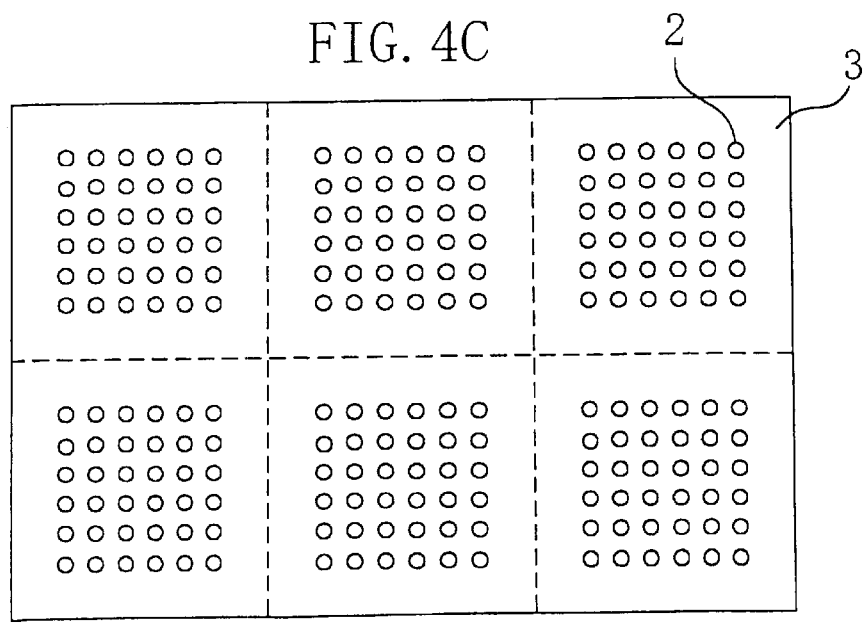
Figure 5A:
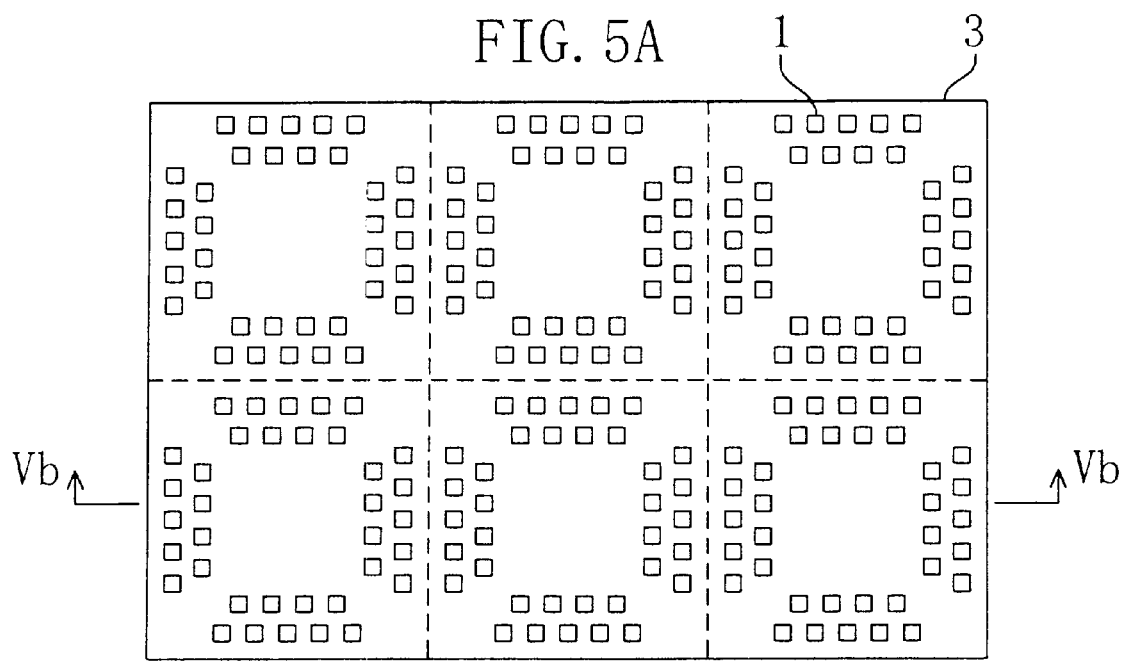
FIGS. 5A and 5B are respectively a plan view, and a cross-sectional view taken along the line Vb—Vb, illustrating a substrate preparation process step in the fabrication process of the semiconductor device of the embodiment.
Figure 5B:
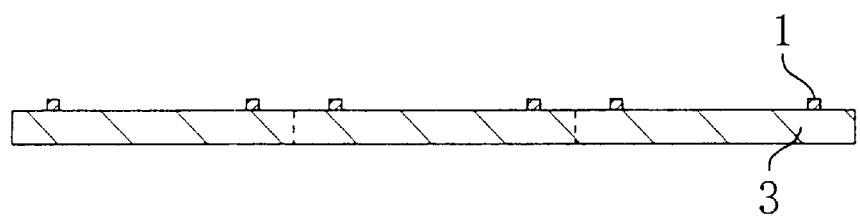
Figure 6A:
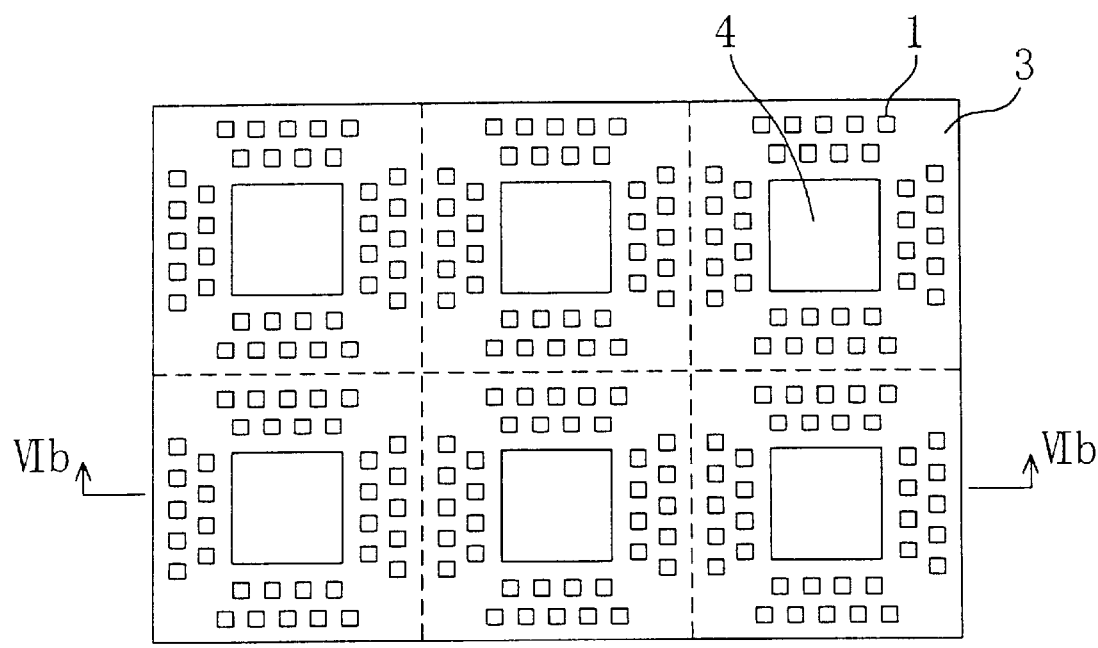
FIGS. 6A and 6B are respectively a plan view, and a cross-sectional view taken along the line VIb—VIb, illustrating a die bonding process step in the fabrication process of the semiconductor device of the embodiment.
Figure 6B:
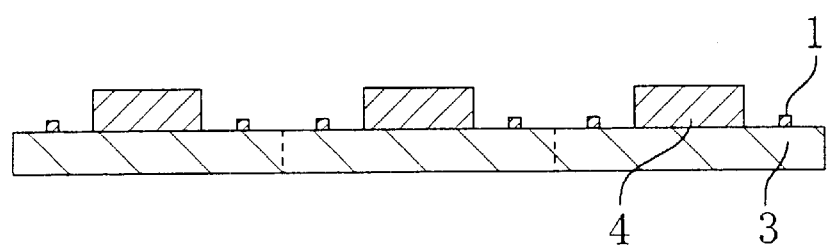
Figure 7A:
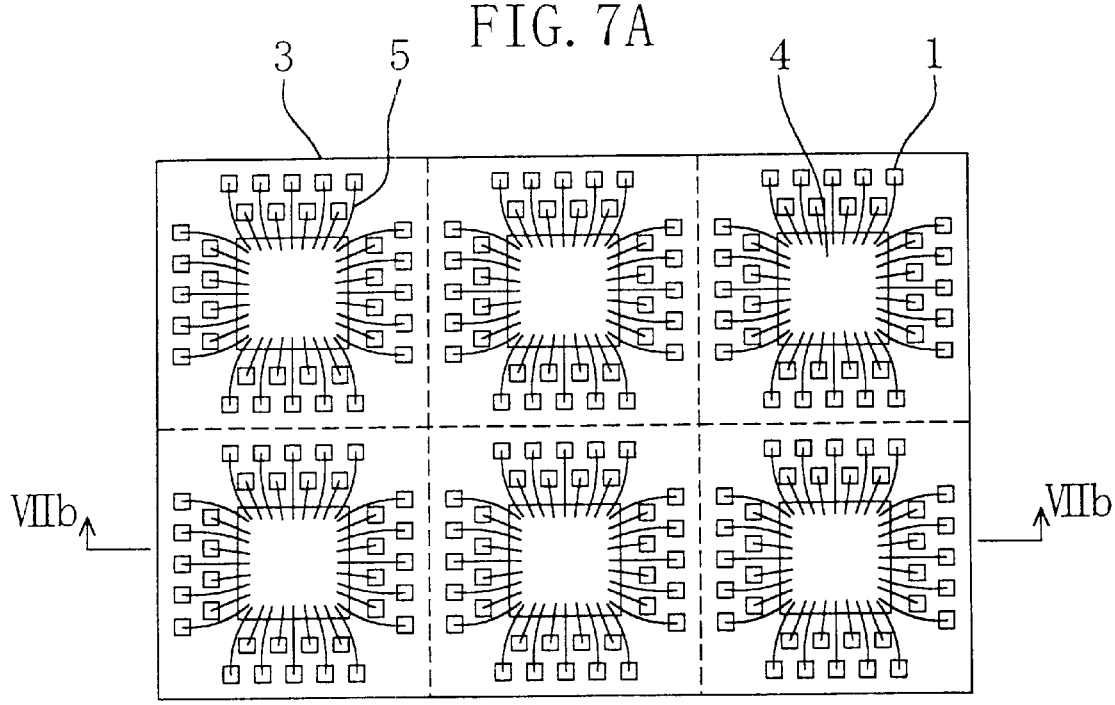
FIGS. 7A and 7B are respectively a plan view, and a cross-sectional view taken along the line VIIb—VIIb, illustrating a wire bonding process step in the fabrication process of the semiconductor device of the embodiment.
Figure 7B:
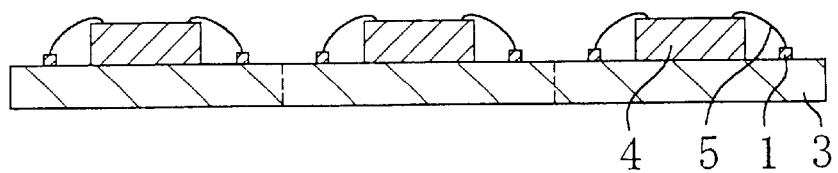
Figure 8A:
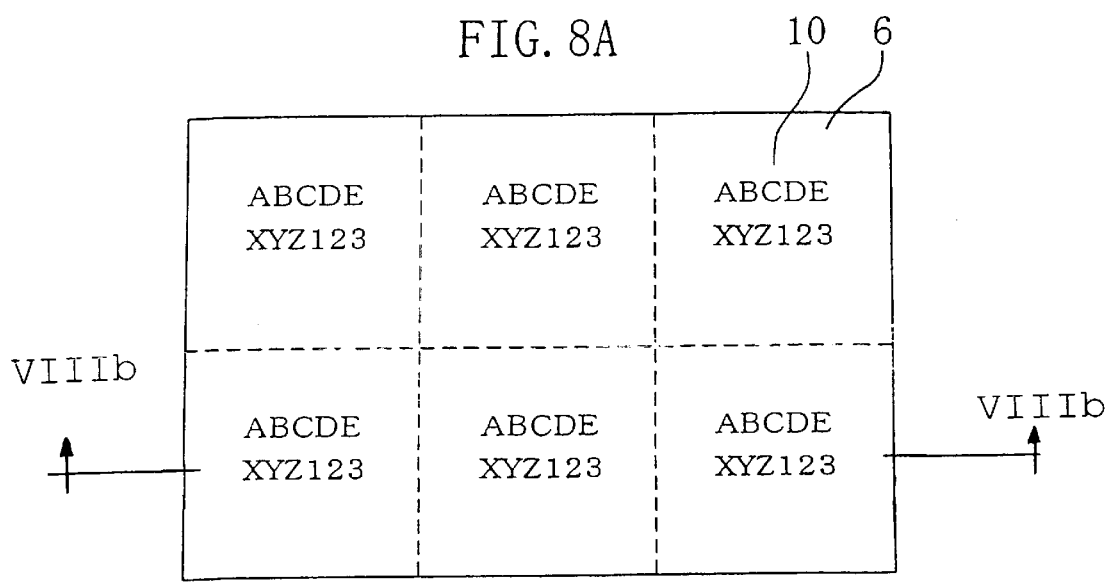
FIGS. 8A and 8B are respectively a plan view, and a cross-sectional view taken along the line VIIIb—VIIIb, illustrating a resin molding process step in the fabrication process of the semiconductor device of the embodiment.
Figure 8B:
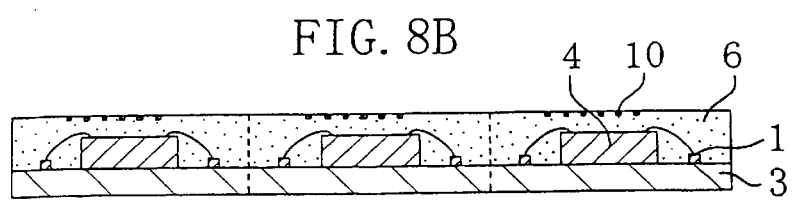

Next, the fabrication process of the semiconductor device of this embodiment will be described. FIGS. 4A, 4B and 4C are respectively plan view, cross-sectional view taken along the line IVb—IVb, and bottom view illustrating a wiring substrate in accordance with this embodiment. FIGS. 5A and 5B are respectively a plan view, and a cross-sectional view taken along the line Vb—Vb, illustrating a substrate preparation process step in the fabrication process of the semiconductor device of this embodiment. FIGS. 6A and 6B are respectively a plan view, and a cross-sectional view taken along the line VIb—VIb, illustrating a die bonding process step in the fabrication process of the semiconductor device of this embodiment. FIGS. 7A and 7B are respectively a plan view, and a cross-sectional view taken along the line VIIb—VIIb, illustrating a wire bonding process step in the fabrication process of the semiconductor device of this embodiment. FIGS. 8A and 8B are respectively a plan view, and a cross-sectional view taken along the line VIIIb—VIIIb, illustrating a resin molding process step in the fabrication process of the semiconductor device of this embodiment. FIGS. 9A and 9B are respectively a plan view, and a cross-sectional view taken along the line IXb—IXb, illustrating a cutting process step in the fabrication process of the semiconductor device of this embodiment.

As shown in FIGS. 4A thorough 4C, the multiple wiring electrodes 1 are formed on the upper surface of the wiring substrate, and external pad electrodes 7 are formed on the lower surface of the wiring substrate. The external pad electrodes 7 are electrically connected to the wiring electrodes 1 through the substrate. The ball electrodes will be attached to the external pad electrodes 7 in the subsequent process step. The wiring substrate prepared is a large-sized substrate on which multiple semiconductor chips will be mounted and which will be later separated into individual semiconductor devices. The broken lines shown in FIGS. 4A and 4C are cutting lines, which will be used to separate the substrate into the individual semiconductor devices. Also, in each of the regions defined by the cutting lines in FIG. 4A, a central area surrounded by the arrays of the wiring electrodes 1 is a chip mounting area where each of the semiconductor chips is mounted by bonding.

First, the wiring substrate with the structure shown in FIGS. 4A through 4C is prepared in the substrate preparation process step shown in FIGS. 5A and 5B.

Next, in the die bonding process step shown in FIGS. 6A and 6B, each of the semiconductor chips 4 is bonded, with an adhesive, onto each of the chip mounting areas of the wiring substrate, with the principal surface of the semiconductor chip 4 facing upward. Specifically, the bottom face of the semiconductor chip 4 and the upper surface of the wiring substrate are secured to each other with the adhesive in this embodiment.

Subsequently, the electrode pads (not shown) of the semiconductor chips 4 and their associate wiring electrodes 1 formed on the wiring substrate are electrically connected to each other with the metal fine wires 5 in the wire bonding process step shown in FIGS. 7A and 7B.

Then, the members disposed on the upper surface of the wiring substrate, e.g., the semiconductor chips 4, wiring electrodes 1 and metal fine wires 5, are molded with the resin encapsulant 6 in the resin molding process step shown in FIGS. 8A and 8B. The molding process step is performed by transfer-molding, and the substantially entire region of the wiring substrate except for a marginal portion thereof, which will be used to carry the substrate, for example, is molded. The wiring electrodes 1 and semiconductor chips 4 are indicated by the broken lines in FIG. 8A. However, the metal fine wires 5 are not shown in the figure.

As will be described in detail, marking and resin molding are performed at the same time in the resin molding process step. In this case, when the upper surface of the wiring substrate is molded with the resin encapsulant 6, a transfer sheet, on which the mark members have been formed, is interposed between the upper surface region of the wiring substrate and a die used for the resin molding. In this manner, the mark members 10 can be embedded in the upper surface of the resin encapsulant 6. After the resin molding process step has been performed, the transfer sheet is removed, whereby the mark members is transferred to and formed in the upper surface of the resin encapsulant 6. The transfer sheet is removed, for example, by peeling, from the resin encapsulant.

Next, the wiring substrate having the upper surface entirely molded with the resin encapsulant 6, is cut along the cutting lines using a rotary blade in the cutting process step shown in FIGS. 9A and 9B, thereby obtaining individual semiconductor devices 11 of the BGA type. Hence, the semiconductor devices 11 with the structure shown in FIGS. 1, 2, and 3 can be obtained.

In this embodiment, the wiring substrate is cut along the cutting lines indicated by the broken lines shown in FIGS. 4A and 4C by using the rotary blade. In this manner, the individual semiconductor devices can be obtained accurately. Normally, the separation by the rotary blade is performed using a dicing machine used in the fabrication process of the semiconductor device. Also, the wiring substrate is cut from either the lower surface or the resin encapsulant 6 side thereof in the known cutting process step. In the fabrication process of this embodiment, the wiring substrate is cut from the lower surface thereof. In this manner, the substrate can be kept immobile while being cut.

In the subsequent process step, which is not shown, in each of the individual semiconductor devices 11, solder balls are attached to the external pad electrodes 7 formed on the lower surface of the wiring substrate 3, thereby forming the ball electrodes 2 which will be used as external terminals.

Alternatively, before cutting the wiring substrate into the individual semiconductor devices 11, the ball electrodes 2 may be formed on the external pad electrodes 7 on the lower surface of the wiring substrate, for each of the large-sized wiring substrates. In this manner, the ball electrodes 2 can be formed more efficiently.

Next, it will be described how the mark members are transferred and formed during the process step for molding the upper surface of the wiring substrate.

Figure 10:
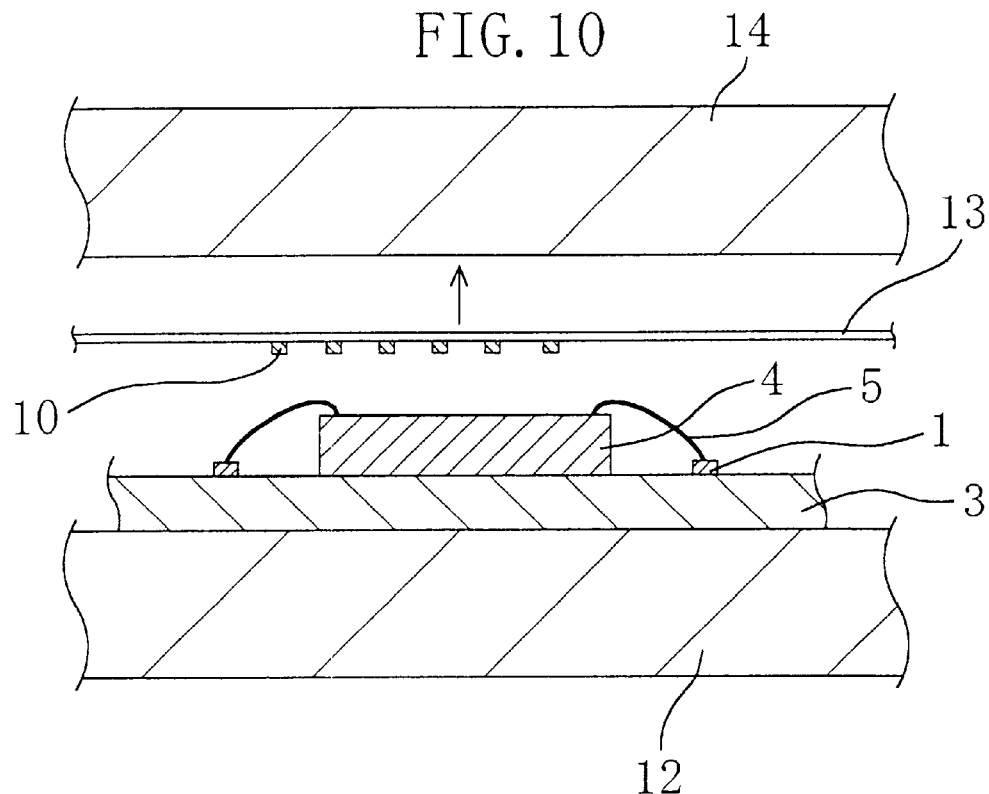
FIG. 10 is a cross-sectional view illustrating an exemplary method for transferring mark members in the resin molding process step in the fabrication process of the semiconductor device of the embodiment.

FIG. 10 is a cross-sectional view illustrating an exemplary method for transferring the mark members in the resin molding process step. As shown in FIG. 10, a molding die includes a lower die 12 and an upper die 14. On the wiring substrate, the semiconductor chips 4 are mounted and the wiring electrodes 1 and the semiconductor chips 4 are connected to each other via the metal fine wires 5. The wiring substrate is disposed on the lower die 12 with the semiconductor chips 4 facing upward. The mark members 10 such as characters, for example, made of ink including pigment or dyestuff, or other visible materials, have been formed on the transfer sheet 13. The transfer sheet 13 is airtightly fixed on the upper die 14 in the cavity. In this case, the side of the transfer sheet 13, on which the mark members 10 have been formed, faces the wiring substrate. Then, the upper and lower dies 14 and 12 are closed and the resin encapsulant is injected into the cavity, whereby the members disposed on the upper surface of the wiring substrate are entirely molded with the resin encapsulant. The transfer sheet 13 is tensile, i.e., tension is applied to the transfer sheet 13 during the resin molding process step. In this manner, wrinkles caused by the thermal shrinkage of the transfer sheet 13 can be prevented and thus the upper surface of the resin encapsulant can be planarized.

Figure 11:
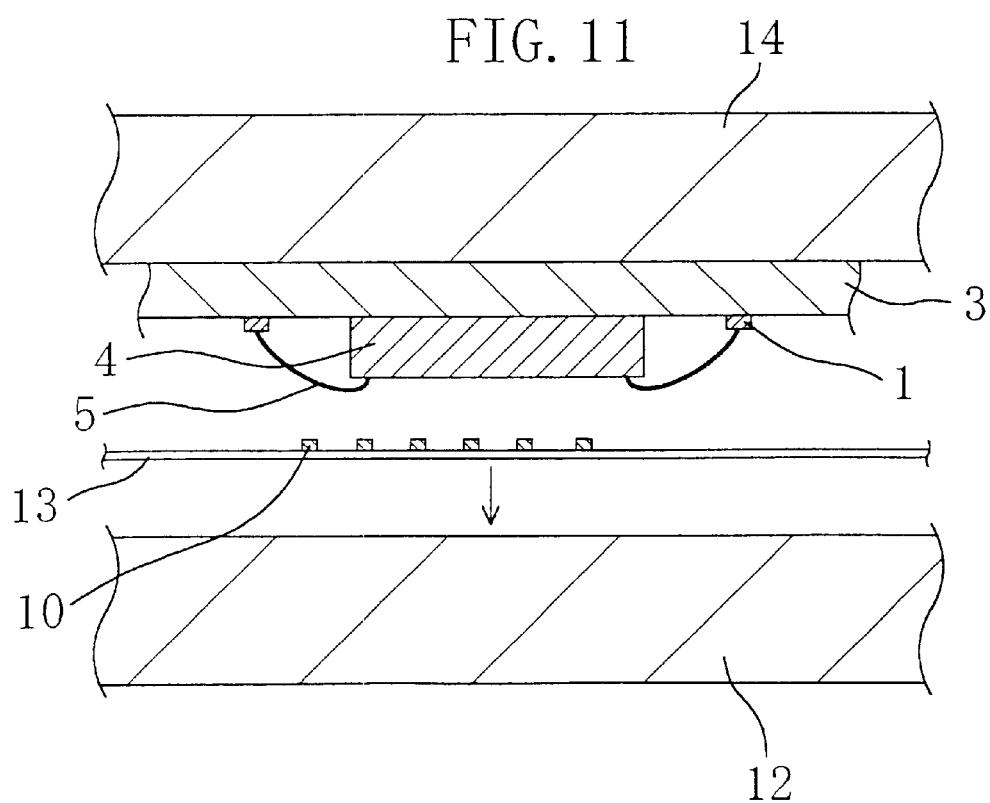
FIG. 11 is a cross-sectional view illustrating another exemplary method for transferring the mark members in the resin molding process step in the fabrication process of the semiconductor device of the embodiment.
Figure 12:
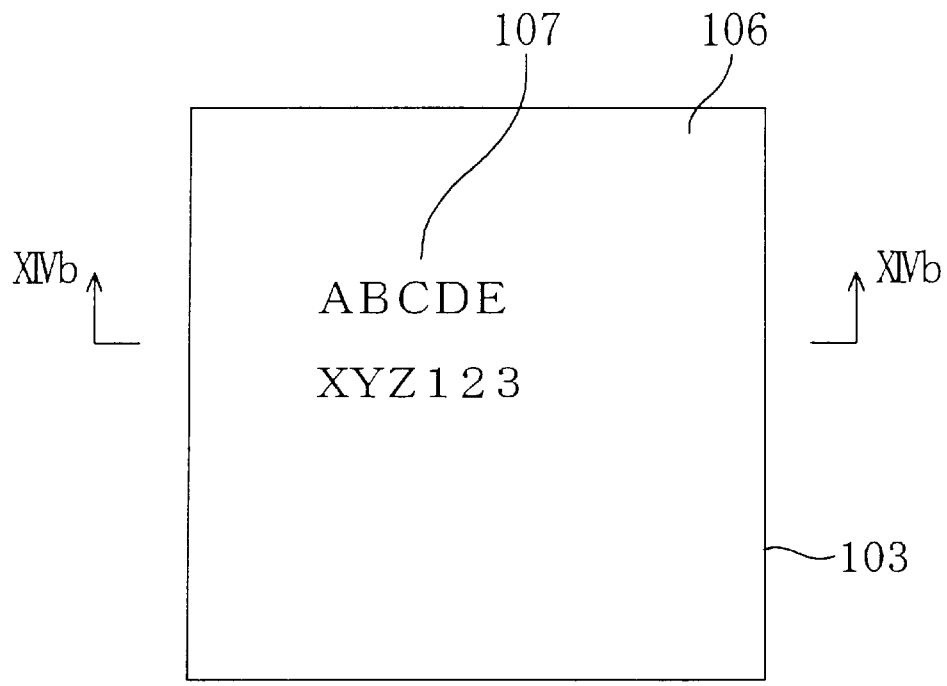
FIG. 12 is a plan view illustrating a known semiconductor device of the BGA type.
Figure 13:
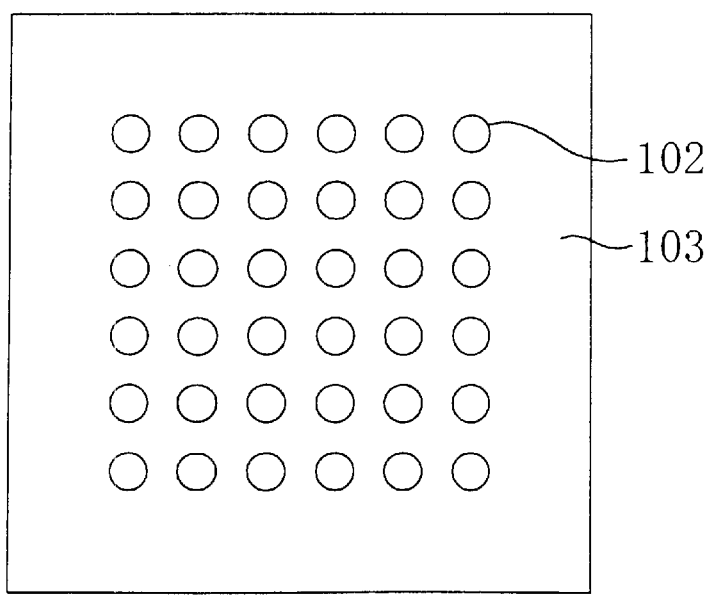
FIG. 13 is a bottom view illustrating the known BGA type semiconductor device.
Figure 14:
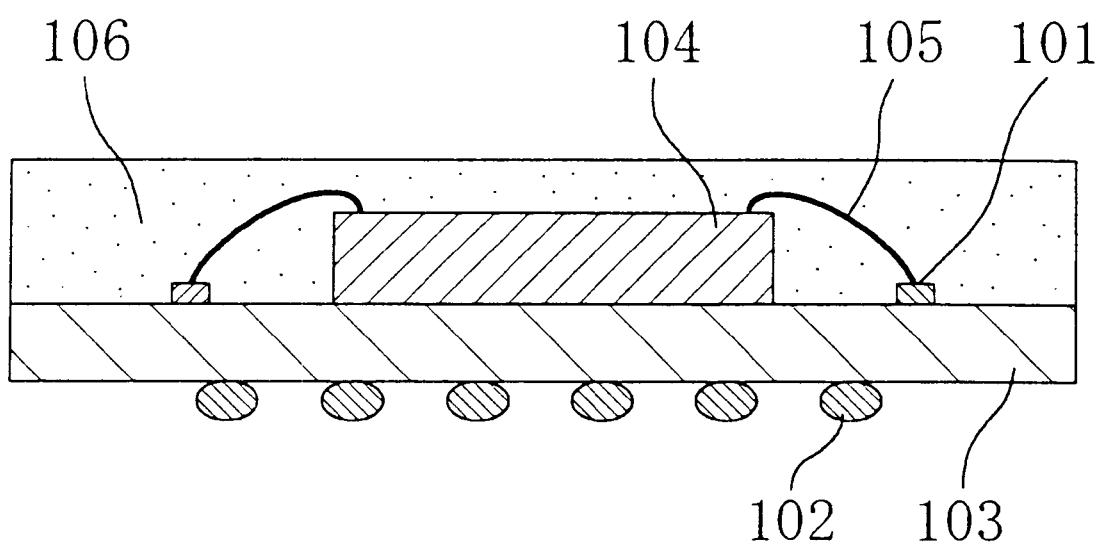
FIG. 14 is a cross-sectional view thereof taken along the line XIV—XIV in FIG. 12.
Figure 15A:
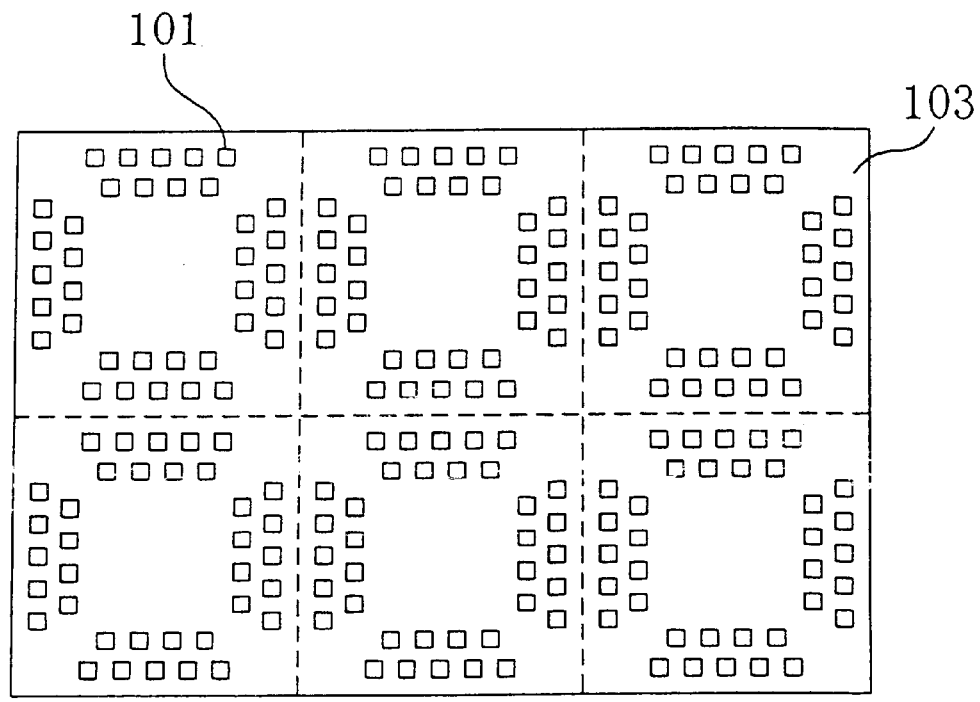
FIGS. 15A and 15B are respectively a plan view and a bottom view illustrating a wiring substrate in the known semiconductor device.
Figure 15B:
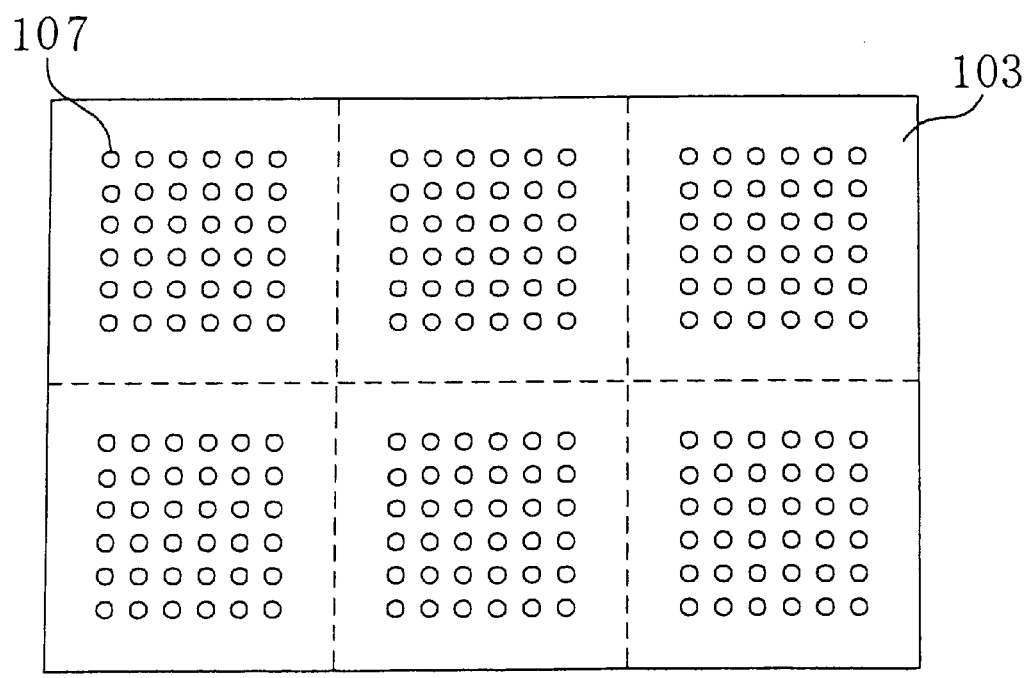
Figure 16A:
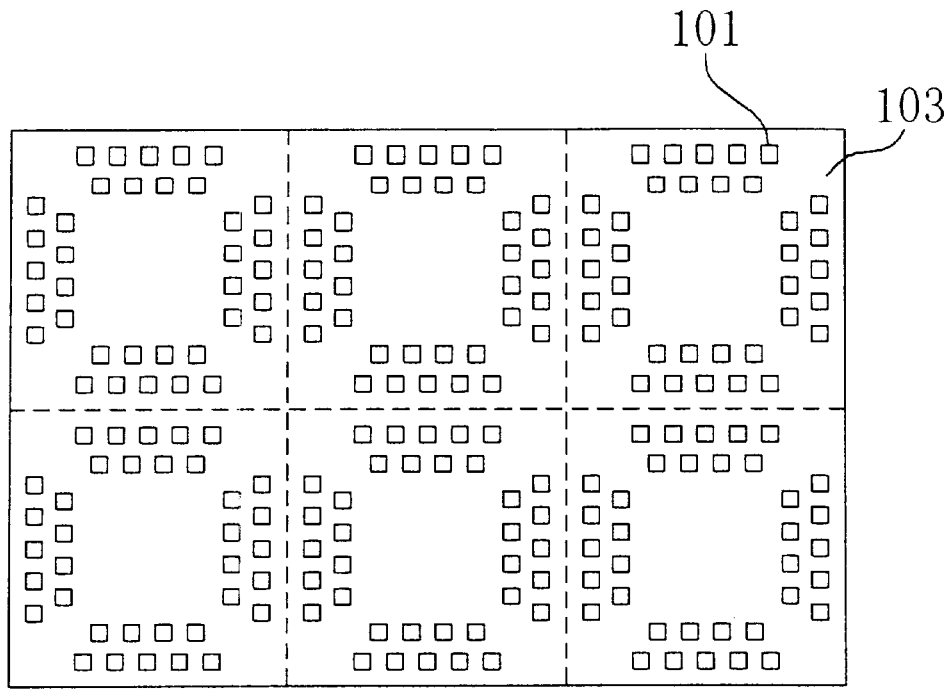
FIGS. 16A and 16B are plan views illustrating a substrate preparation process step and a die bonding process step, respectively, in the fabrication process of the known semiconductor device.
Figure 16B:
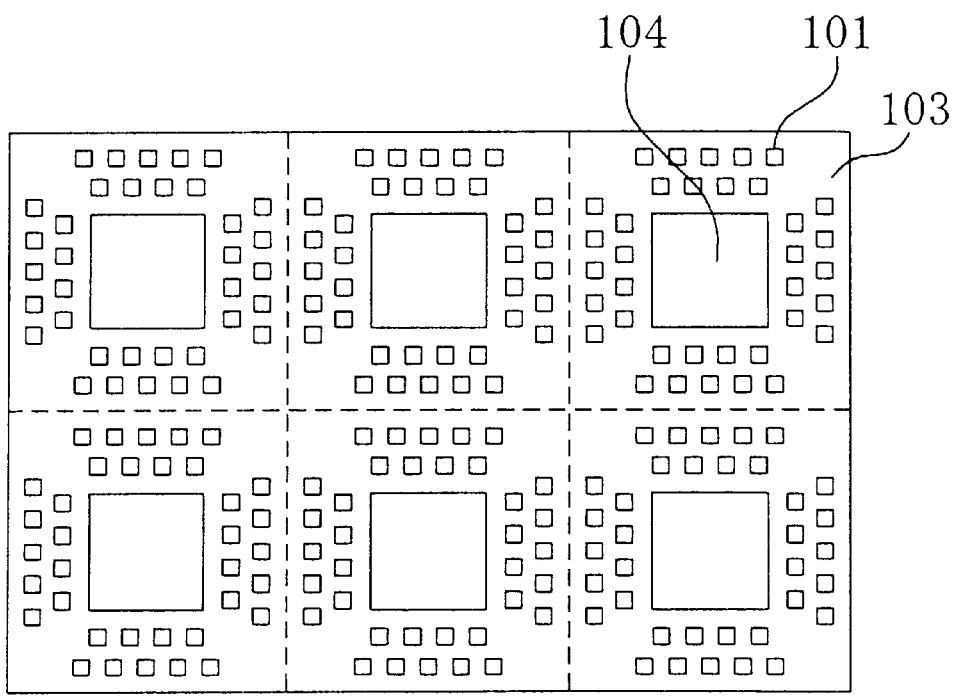
Figure 17A:
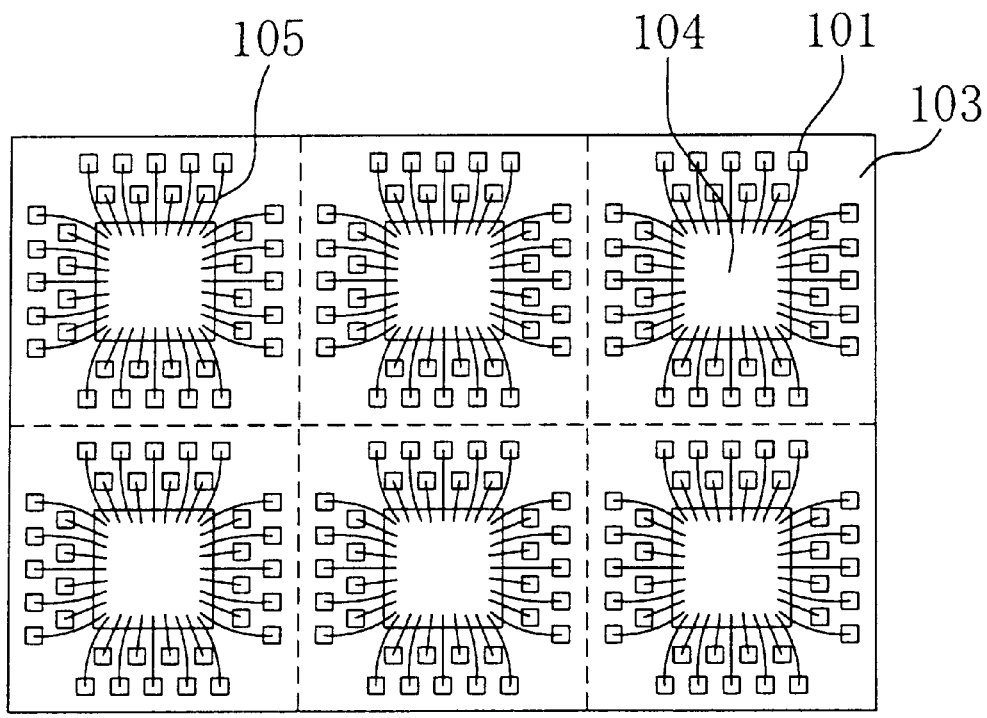
FIGS. 17A and 17B are plan views illustrating a wire bonding process step and a resin molding process step, respectively, in the fabrication process of the known semiconductor device.
Figure 17B:
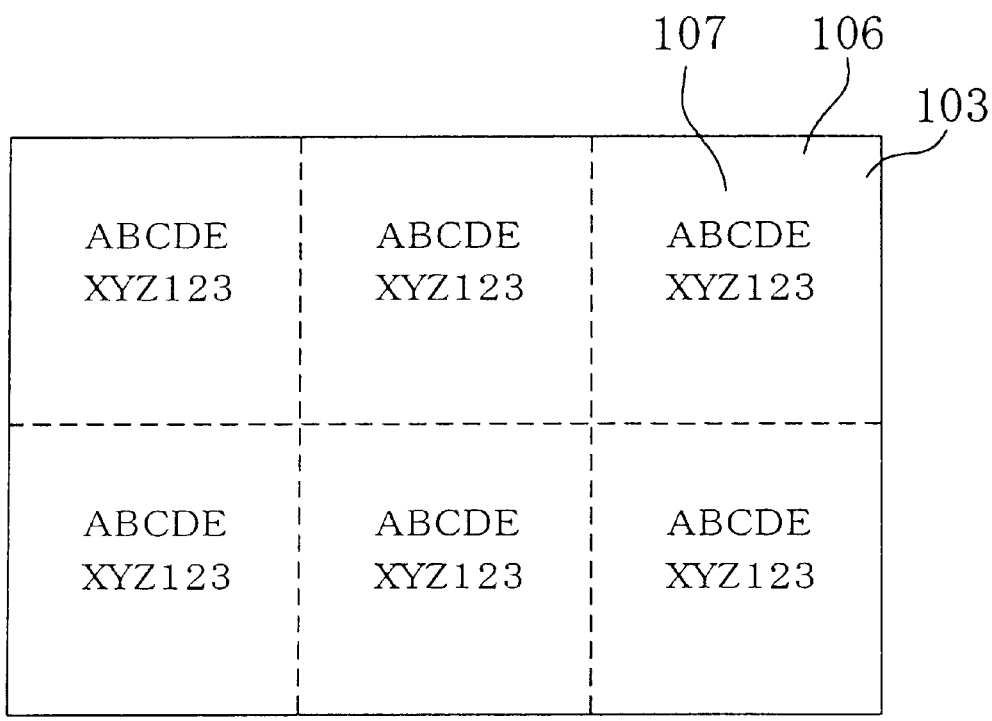

FIG. 11 is a cross-sectional view illustrating another exemplary method for transferring the mark members in the resin molding process step. As shown in FIG. 11, the transfer sheet 13 is airtightly fixed on the lower die 12 in the cavity, while the wiring substrate is disposed on the upper die 14 with the semiconductor chips 4 facing downward. Hence, when the resin molding process step is performed in this method, the positions of the wiring substrate and the transfer sheet 13 are interchanged, i.e., the positions are upside down as compared to those shown in FIG. 10.

In the both methods shown in FIGS. 10 and 11, the resin molding process step may be performed with the transfer sheet 11 interposed between the face of the wiring substrate on which the semiconductor chips 4 are mounted and the lower or upper die 12 or 14 facing the wiring substrate.

According to the method for fabricating the semiconductor device in accordance with this embodiment, when the resin encapsulant is injected into the cavity, the transfer sheet 13 with the mark members 10 formed thereon is airtightly fixed on the die facing the semiconductor chips 4 on the wiring substrate in the cavity, as shown in FIGS. 10 and 11. In this manner, marks, which are the mark members 10 embedded in the upper surface of the resin encapsulant, can be obtained easily through the single resin molding process step. Accordingly, the highly visible marks can be efficiently formed at low cost.

Also, the usage of the transfer sheet in the resin molding process step enables the resin encapsulant to be molded airtightly in the cavity, preventing resin leakage or resin burr, for example. Thus, the semiconductor device of the BGA type of high quality can be obtained.

When the transfer sheet is peeled off after the resin molding process step has been performed, only the mark members 10 remain in the upper surface of the resin encapsulant 6. Therefore, this method can be a transfer method.

It should be noted that the transfer sheet with the mark members 10 may be temporarily adhered to the die to be airtightly fixed thereon, if necessary.

The transfer sheet used in the present invention may be made from material which contains polyethylene terephthalate as a major constituent and which has resistance to heat and heat shrinkage during the resin molding process step. The strength of adhesion between the mark members and the transfer sheet and between the mark members and the resin encapsulant is adjusted so that the mark members can be separated from the transfer sheet and transferred to the resin encapsulant when the transfer sheet is removed after the resin molding process step has been performed.

The mark members 10 used in the present invention may be made of, for example, ink including pigment or dyestuff, or other visible materials which have resistance to heat and thermal shrinkage. Also, a clear color is preferably selected for the mark members 10 considering coloration and contrast to the resin encapsulant. The mark members 10 in this embodiment have a white color.

In the foregoing embodiment, the present invention has been described as being applied to a semiconductor device in which members disposed on the upper surface of a wiring substrate are molded. However, the present invention is not limited to this embodiment but is applicable to a semiconductor device including a leadframe instead of the wiring substrate, and a double-side-molded semiconductor device.

What is claimed is:

1. A method for fabricating a semiconductor device, comprising the steps of:
    a) preparing a wiring substrate, which includes a wiring electrode and an external electrode, respectively, on the upper surface and the lower surface of the wiring substrate, the external electrode being to be electrically connected to the wiring electrode;
    b) mounting semiconductor chips on the wiring substrate;
    c) connecting an electrode of each of the semiconductor chips and the wiring electrode on the wiring substrate electrically to each other with a connecting member;
    d) disposing the wiring substrate on a face of one die of a molding die after the step c) has been performed,
        disposing a transfer sheet, on which a mark member has been formed, on a face of the other die of the molding die, and
        performing a resin molding process; and
    e) removing the transfer sheet and embedding the mark member in the upper surface of a resin encapsulant by transcription, after the step d) has been performed.

2. The method of claim 1, wherein in the step e), the wiring substrate is separated into individual semiconductor devices by using a rotary blade.

3. The method of claim 1, wherein a ball electrode is attached to the external electrode on the lower surface of the wiring substrate between the steps d) and e).

4. The method of claim 1, wherein in the step a), the wiring substrate, on which the semiconductor chips can be mounted and which can be separated into individual semiconductor devices, is prepared.

5. The method of claim 1, wherein in the step d), a side of the transfer sheet faces the wiring substrate and the transfer sheet is airtightly fixed on the face of the die of the molding die, the side including the mark member formed thereon.

6. The method of claim 1, wherein in the step d), the transfer sheet includes the mark member formed thereon that is visible and that can be separated from the transfer sheet.

* * * * *